US012740327B2

(12) United States Patent
Wang et al.

(10) Patent No.: US 12,740,327 B2
(45) Date of Patent: Sep. 15, 2026

(54) SEMICONDUCTOR DEVICE

(71) Applicant: UNITED MICROELECTRONICS CORP., Hsin-Chu City (TW)

(72) Inventors: Hui-Lin Wang, Taipei City (TW); Chun-Hsien Lin, Tainan City (TW)

(73) Assignee: UNITED MICROELECTRONICS CORP., Hsin-Chu City (TW)

(*) Notice: Subject to any disclaimer, the term of this patent is extended or adjusted under 35 U.S.C. 154(b) by 223 days.

(21) Appl. No.: 18/791,412

(22) Filed: Jul. 31, 2024

(65) Prior Publication Data

US 2024/0397833 A1 Nov. 28, 2024

Related U.S. Application Data

(63) Continuation of application No. 18/118,669, filed on Mar. 7, 2023, now Pat. No. 12,089,507, which is a continuation of application No. 17/134,485, filed on Dec. 27, 2020, now Pat. No. 11,631,803.

(30) Foreign Application Priority Data

Nov. 27, 2020 (CN) ......................... 202011354032.3

(51) Int. Cl.
*H10N 50/80* (2023.01)
*H10B 61/00* (2023.01)

(52) U.S. Cl.
CPC ............. *H10N 50/80* (2023.02); *H10B 61/00* (2023.02)

(58) Field of Classification Search
CPC ...................................................... H10N 50/80
See application file for complete search history.

(56) References Cited

U.S. PATENT DOCUMENTS

| | | | | |
|---|---|---|---|---|
| 6,928,015 | B2 | 8/2005 | Ooishi | |
| 8,441,850 | B2 | 5/2013 | Lee et al. | |
| 2003/0235070 | A1* | 12/2003 | Ooishi | H10B 61/22 365/158 |
| 2012/0087184 | A1 | 4/2012 | Lee | |
| 2017/0104029 | A1* | 4/2017 | Li | H10N 50/10 |
| 2018/0366517 | A1 | 12/2018 | Lin | |
| 2019/0378971 | A1 | 12/2019 | Chu | |
| 2020/0266335 | A1 | 8/2020 | Wang | |
| 2020/0286952 | A1 | 9/2020 | Chuang | |

FOREIGN PATENT DOCUMENTS

| | | | |
|---|---|---|---|
| CN | 109994500 | A | 7/2019 |
| CN | 110581213 | A | 12/2019 |
| CN | 111564468 | A | 8/2020 |

* cited by examiner

*Primary Examiner* — Shih Tsun A Chou
(74) *Attorney, Agent, or Firm* — Winston Hsu

(57) ABSTRACT

A semiconductor device for internet of things (IoT) device includes a substrate having an array region defined thereon and a ring of dummy pattern surrounding the array region. Preferably, the ring of dummy pattern includes a plurality of magnetic tunneling junctions (MTJs) and a ring of metal interconnect pattern overlapping the MTJs and surrounding the array region. The semiconductor device further includes a gap between the array region and the ring of dummy pattern.

9 Claims, 3 Drawing Sheets

SEMICONDUCTOR DEVICE

CROSS REFERENCE TO RELATED APPLICATIONS

This application is a continuation application of U.S. application Ser. No. 18/118,669, filed on Mar. 7, 2023, which is a continuation application of U.S. application Ser. No. 17/134,485, filed on Dec. 27, 2020. The contents of these applications are incorporated herein by reference.

BACKGROUND OF THE INVENTION

1. Field of the Invention

The invention relates to a semiconductor device, and more particularly to a magnetoresistive random access memory (MRAM) for internet of things (IoT).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device for internet of things (IoT) device includes a substrate having an array region defined thereon and a ring of dummy pattern surrounding the array region. Preferably, the ring of dummy pattern includes a plurality of magnetic tunneling junctions (MTJs) and a ring of metal interconnect pattern overlapping the MTJs and surrounding the array region. The semiconductor device further includes a gap between the array region and the ring of dummy pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
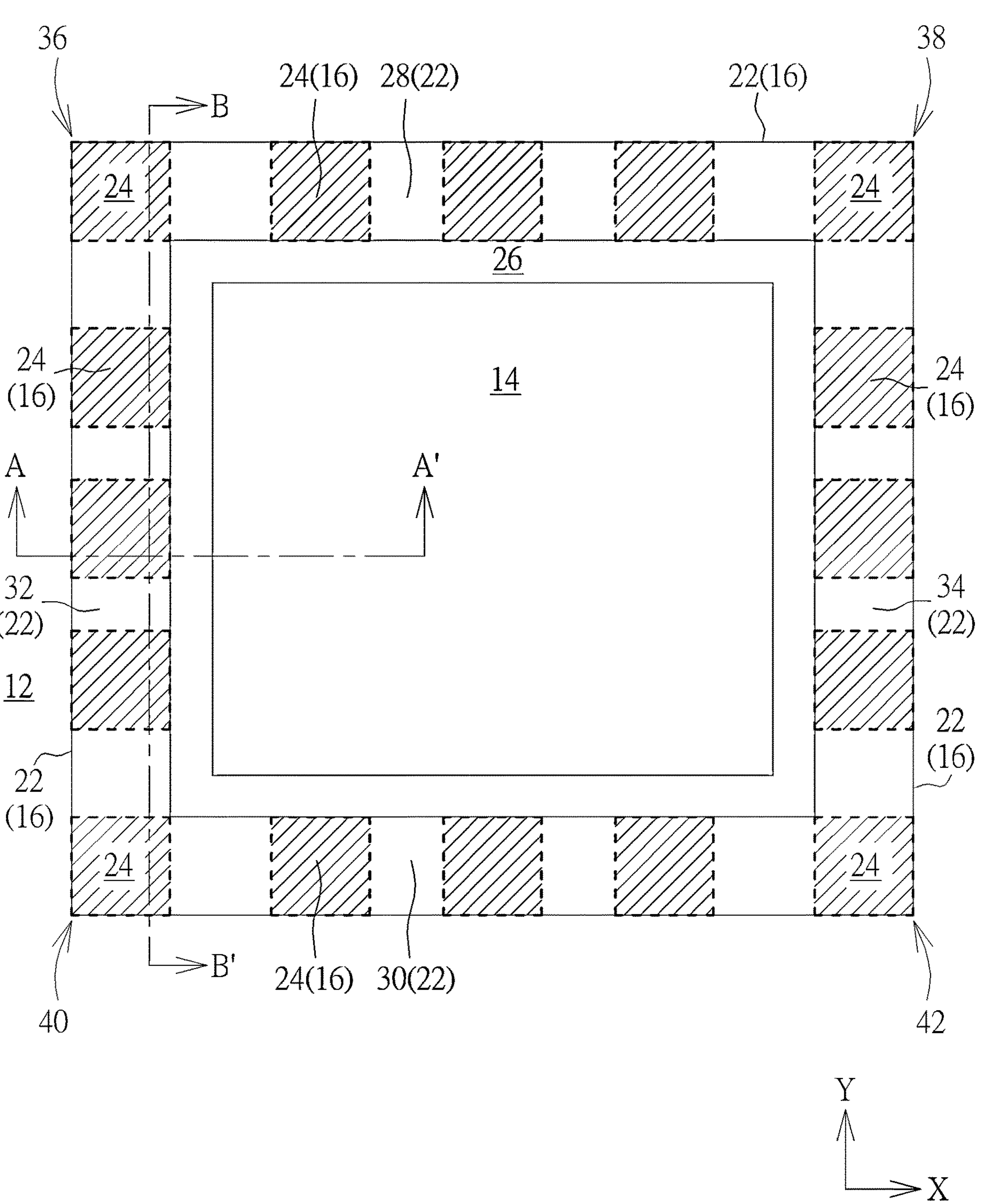
FIG. 1 illustrates a top view of a semiconductor device according to an embodiment of the present invention.
Figure 2:
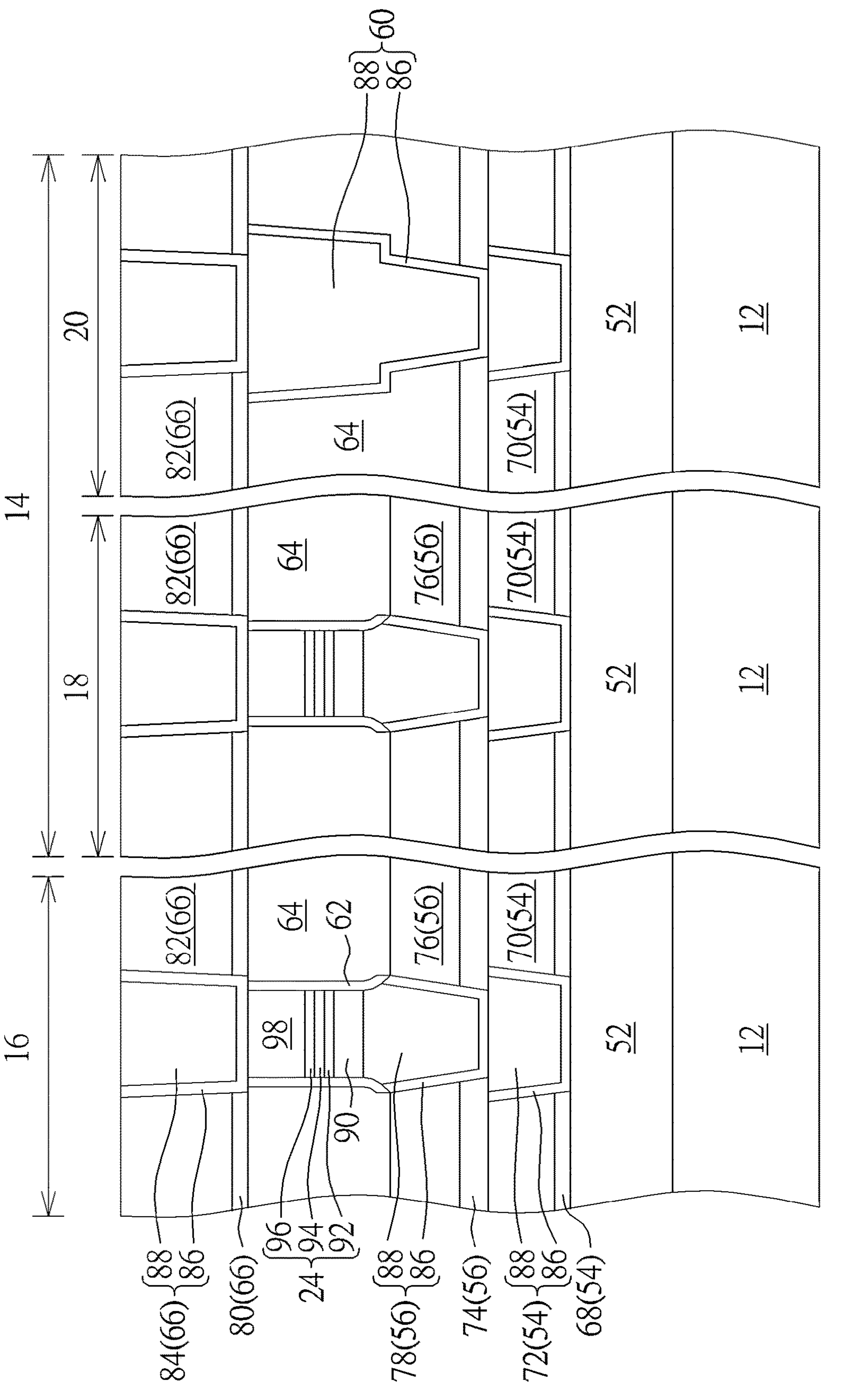
FIG. 2 illustrates a cross-section of the semiconductor device taken along the sectional line AA' of FIG. 1.
Figure 3:
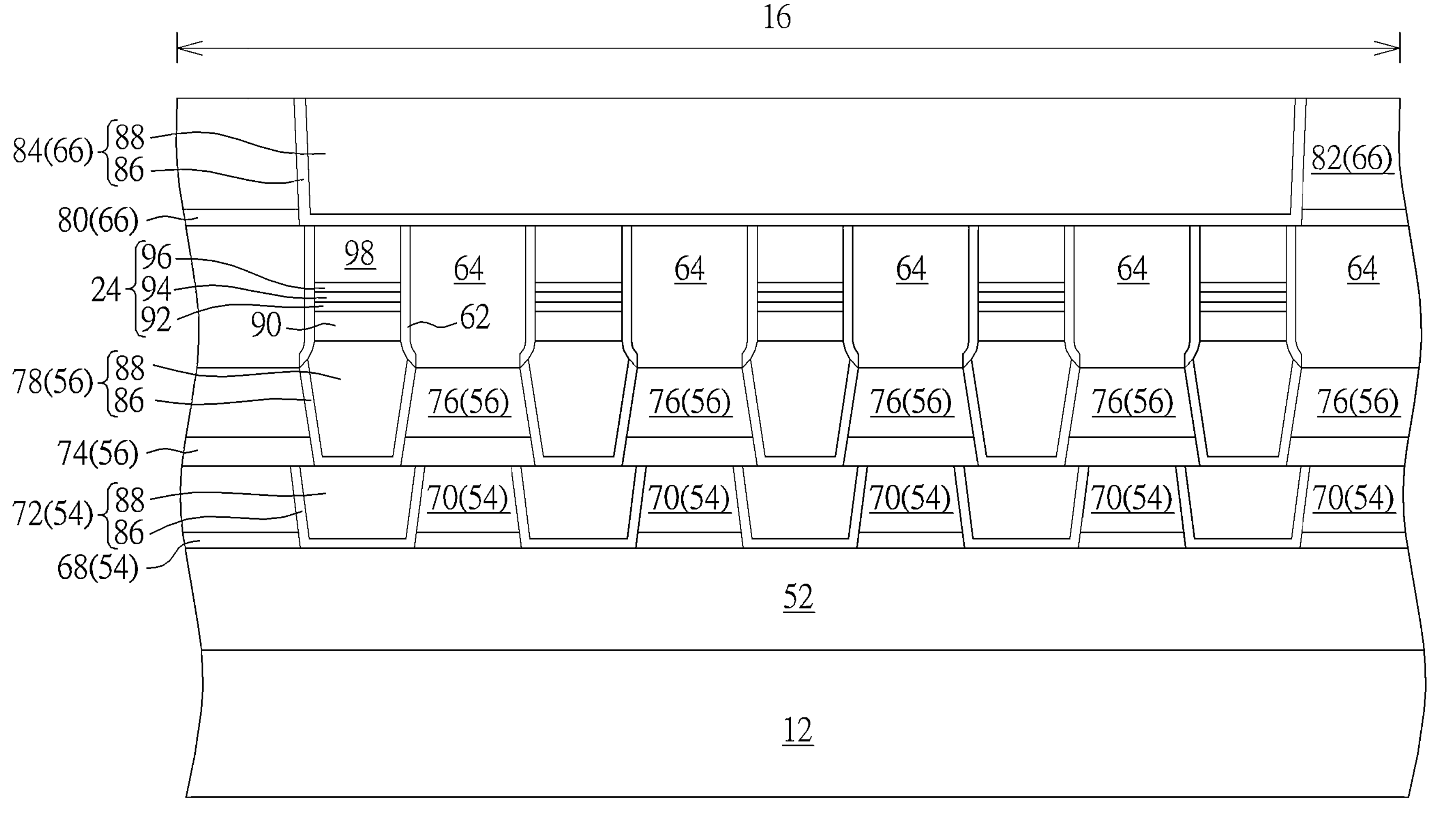
FIG. 3 illustrates a cross-section of the semiconductor device taken along the sectional line BB' of FIG. 1.

Referring to FIGS. 1-3, FIG. 1 illustrates a top view of a semiconductor device, or more specifically a MRAM device according to an embodiment of the present invention, FIG. 2 illustrates a cross-section of the MRAM device taken along the sectional line AA' of FIG. 1, and FIG. 3 illustrates a cross-section of the MRAM device taken along the sectional line BB' of FIG. 1. As shown in FIGS. 1-3, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). An array region 14 and a ring of dummy MTJ pattern 16 surrounding the array region 14 are defined on the substrate 12, in which the array region 14 in this embodiment could also be referred to as a MRAM macro region and the array region 14 could further include a MRAM region 18 and a logic region 20.

In this embodiment, the dummy MTJ pattern 16 further includes a plurality of MTJs 24 and a ring of metal interconnect pattern 22 overlapping the MTJs 24 and surrounding the array region 14. Moreover, the MRAM device also includes a gap 26 disposed between the array region 14 and the ring of dummy MTJ pattern 16 so that the dummy MTJ pattern 16 does not contact the array region 14 directly. Specifically, the ring of metal interconnect pattern 22 further includes a first metal interconnect pattern 28 and a second metal interconnect pattern 30 extending along a first direction such as X-direction and a third metal interconnect pattern 32 and a fourth metal interconnect pattern 34 extending along a second direction such as Y-direction. Preferably, the first metal interconnect pattern 28 overlaps the third metal interconnect pattern 32 at a first corner 36, the first metal interconnect pattern 28 overlaps the fourth metal interconnect pattern at a second corner 38, the second metal interconnect pattern 30 overlaps the third metal interconnect pattern 32 at a third corner 40, and the second metal interconnect pattern 30 overlaps the fourth metal interconnect pattern 34 at a fourth corner 42.

In other words, the first metal interconnect pattern 28, the second metal interconnect pattern 30, the third metal interconnect pattern 32, and the fourth metal interconnect pattern 34 together constitute a square-shaped or rectangular-shaped ring surrounding the array region 14 while the MTJs 24 overlap the first metal interconnect pattern 28, the second metal interconnect pattern 30, the third metal interconnect pattern 32, and the fourth metal interconnect pattern 34 individually. It should be noted that even though only a single ring of dummy MTJ pattern 16 made of MTJs 24 and metal interconnect pattern 22 is disposed around the array region 14, according to other embodiment of the present invention it would also be desirable to adjust the number of dummy MTJ pattern 16 by forming more than one ring such as two rings or even three rings of dummy MTJ patterns 16 surrounding the array region 14, which are all within the scope of the present invention.

In this embodiment, each of the MTJs 24 under a top view perspective includes a square or rectangle and the MTJs 24 not only overlaps the first meta interconnect pattern 28, the second metal interconnect pattern 30, the third metal interconnect pattern 32, and the fourth metal interconnect pattern 34 but also overlaps the four corners including the first corner 36, the second corner 38, the third corner 40, and the fourth corner 42. It should be noted that even though only three MTJs 24 are shown to overlap the first metal interconnect pattern 28, the second metal interconnect pattern 30, the third metal interconnect pattern 32, and the fourth metal interconnect pattern 34 not counting the ones overlapping the four corners, according to other embodiment of the present invention it would also be desirable to adjust the number of the MTJs 24 overlapping the first metal interconnect pattern 28, the second metal interconnect pattern 30, the third metal interconnect pattern 32, and the fourth metal interconnect pattern 34. For instance, it would be desirable to disposed only one or more than one MTJs 24 under the first metal interconnect pattern 28, the second metal interconnect pattern 30, the third metal interconnect pattern 32, and the fourth metal interconnect pattern 34, which are all within the scope of the present invention.

Moreover, it should be noted that even though each of the MTJs 24 in this embodiment preferably share equal size such as equal lengths and equal widths, according to other embodiment of the present invention it would also be desirable to adjust the sizes of the MTJs 24 so that the MTJs 24 could have different lengths and/or different widths. For instance, the MTJs 24 overlapping the four corners could include a first size and the MTJs 24 overlapping the first metal interconnect pattern 28, the second metal interconnect pattern 30, the third metal interconnect pattern 32, and the fourth metal interconnect pattern 34 other than the four corners could include a second size that is different from the first size, in which the definition of different size in this embodiment could refer to same lengths and different widths or same widths and different lengths, which are all within the scope of the present invention.

According to yet another embodiment of the present invention, the MTJs 24 could also be disposed to only overlap the first metal interconnect pattern 28, the second metal interconnect pattern 30, the third metal interconnect pattern 32, and the fourth metal interconnect pattern 34 enclosing the array region 14 but not overlapping the four corners including the first corner 36, the second corner 38, the third corner 40, and the fourth corner 42, which is also within the scope of the present invention.

As shown in the cross-section views in FIGS. 2-3, active devices such as metal-oxide semiconductor (MOS) transistors, passive devices, conductive layers, and interlayer dielectric (ILD) layer 52 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates), source/drain regions, spacers, epitaxial layers, and contact etch stop layer (CESL). The ILD layer 52 could be formed on the substrate 12 to cover the MOS transistors, and a plurality of contact plugs (not shown) could be formed in the ILD layer 52 to electrically connect to the gate structure and/or source/drain region of MOS transistors. Since the fabrication of planar or non-planar transistors and ILD layer is well known to those skilled in the art, the details of which are not explained herein for the sake of brevity.

The semiconductor device also includes metal interconnect structures 54, 56 disposed on the ILD layer 52, MTJs 24 disposed on metal interconnect structure 56 on the dummy MTJ pattern 16 and the MRAM region 18, metal interconnection 60 disposed on the metal interconnect structure 54 on the logic region 20, spacers 62 disposed on sidewalls of the MTJs 24, inter-metal dielectric (IMD) layer 64 disposed around the spacers 62, and another metal interconnect structure 66 disposed on the MTJs 24 and the metal interconnection 60.

In this embodiment, the metal interconnect structure 54 includes a stop layer 68, an IMD layer 70, and a plurality of metal interconnections 72 embedded within the stop layer 68 and the IMD layer 70, the metal interconnect structure 56 includes a stop layer 74, an IMD layer 76, and a plurality of metal interconnections 78 embedded in the stop layer 74 and the IMD layer 76, and the metal interconnect structure 66 includes a stop layer 80, an IMD layer 82, and metal interconnections 84 embedded in the stop layer 80 and the IMD layer 82.

In this embodiment, each of the metal interconnections 72, 78, 84 within the metal interconnect structures 54, 56, 66 and the metal interconnection 60 could be fabricated according to a single damascene or dual damascene process. For instance, each of the metal interconnections 72 preferably include a trench conductor, each of the metal interconnections 78 preferably include a via conductor, each of the metal interconnections 84 preferably include a via conductor, and the metal interconnection 60 preferably includes a trench conductor.

Moreover, each of the metal interconnections 72, 78, 84 could further include a barrier layer 86 and a metal layer 88, in which the barrier layer 86 could be selected from the group consisting of titanium (Ti), titanium nitride (TiN), tantalum (Ta), and tantalum nitride (TaN) and the metal layer 88 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 88 directly under the MTJ 24 is preferably made of tungsten while the rest of the metal layers 88 are preferably made of copper, the IMD layers 70, 76, 82 are preferably made of silicon oxide, and the stop layers 68, 74, 80 are preferably made of nitrogen doped carbide (NDC), silicon nitride, silicon carbon nitride (SiCN), or combination thereof.

In this embodiment, the formation of the MTJ 24 could be accomplished by sequentially forming a bottom electrode 90, a MTJ stack, a top electrode 98, and a patterned mask (not shown) on the metal interconnect structure 56, in which the MTJ stack preferably includes a pinned layer 92, a barrier layer 94, and a free layer 96 on the bottom electrode 90. In this embodiment, the bottom electrode 90 and the top electrode 98 are preferably made of conductive material including but not limited to for example Ta, Pt, Cu, Au, Al, or combination thereof. The pinned layer 92 could be made of ferromagnetic material including but not limited to for example iron, cobalt, nickel, or alloys thereof such as cobalt-iron-boron (CoFeB) or cobalt-iron (CoFe). Moreover, the pinned layer 92 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 92 is formed to fix or limit the direction of magnetic moment of adjacent layers. The barrier layer 94 could be made of insulating material including but not limited to for example oxides such as aluminum oxide ($AlO_x$) or magnesium oxide (MgO). The free layer 96 could be made of ferromagnetic material including but not limited to for example iron, cobalt, nickel, or alloys thereof such as cobalt-iron-boron (CoFeB), in which the magnetized direction of the free layer 96 could be altered freely depending on the influence of outside magnetic field.

Next, a pattern transfer process or a photo-etching process is conducted by using a patterned mask such as patterned resist remove part of the top electrode 98, part of the MTJ stack, and part of the bottom electrode 90 to form the MTJs 24 of the dummy MTJ pattern 16, in which the MTJs 24 preferably directly contacting and electrically connecting the metal interconnections 78 underneath.

It should be noted that even though the bottom electrode 90 or bottom of the MTJs 24 are electrically connecting or directly contacting the metal interconnections 78 of the metal interconnect structure 56, only the MTJs 24 on the MRAM region 18 would connect to the MOS transistors disposed on the surface of the substrate 12 through the metal interconnection 78 underneath. The MTJs 24 of the dummy MTJ pattern 16 on the other hand are dummy MTJs while the metal interconnections 78, 84 directly under or on top of the MTJs 24 of the dummy MTJ pattern 16 are also dummy metal interconnections not electrically connecting any other device or conductive wires. Accordingly, the MTJs 24 and the metal interconnections 78, 84 of the dummy MTJ pattern 16 would together form a dummy barrier around the array region 16.

It should be further noted that the metal interconnections 84 directly above the MTJs 24 as shown in FIGS. 2-3 are also in fact the ring of metal interconnect pattern 22 around the array region 14 shown in FIG. 1. Since the metal interconnect pattern 84 is disposed around the array region 14 like a ring, the bottom surface of the single metal interconnect pattern 84 as shown in the cross-section view of FIG. 3 taken along the sectional line BB' of FIG. 1 would directly contacting a plurality of MTJs 24 at the same time.

If viewed from the top view perspective as shown in FIG. 1, the metal interconnection 84 is disposed around the entire array region 14 as a single unit whereas the plurality of MTJs 24 directly under the metal interconnection 84 are disposed individually around the array region 14 instead of a single unit, in which the MTJs 24 do not contact each other and each of the MTJs 24 could include a square or rectangle if viewed from a top view perspective.

Overall, the present invention preferably provides a semiconductor device utilized for internet of things, in which the semiconductor device includes at least a ring of dummy MTJ pattern surrounding an array region or logic region, in which the ring of dummy MTJ pattern is consisted of a plurality of MTJs and a ring of metal interconnect pattern made of multiple layers of metal interconnections. According to a preferred embodiment of the present invention, the dummy MTJ pattern surrounding the array region or logic region could be used as a barrier for blocking electromagnetic waves, in which the dummy MTJ pattern includes a plurality of MTJs disposed separately around the array region and multiple layers of metal interconnections constituting a ring of metal interconnect pattern disposed on top of the MTJs. Preferably, the MTJs 24 are disposed not contacting each other directly and each of the MTJs 24 shown in FIG. 1 include a rectangular shape if viewed under a top view perspective while the metal interconnect pattern 22 or metal interconnections 84 disposed on top of and connecting the MTJs 24 are formed as single ring surrounding the entire array region 14.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device for internet of things (IoT), the semiconductor device comprising:
- a substrate having an array region defined thereon;
- a first magnetic tunneling junction (MTJ) on the array region;
- a first metal interconnection on the first MTJ;
- a ring of dummy magnetic tunneling junction (MTJ) pattern surrounding the array region, wherein the ring of dummy pattern comprises:
- magnetic tunneling junctions (MTJs); and
- a ring of metal interconnect pattern overlapping the MTJs and surrounding the array region, wherein the MTJs comprise a first gap between adjacent ones of the MTJs, an edge of the MTJs is aligned with an edge of the ring of metal interconnect pattern, and top surfaces of the ring of metal interconnect pattern and the first metal interconnection are coplanar.

2. The semiconductor device of claim 1, further comprising a gap between the array region and the ring of dummy pattern.

3. The semiconductor device of claim 1, wherein the ring of metal interconnect pattern comprises:
- a first metal interconnect pattern and a second metal interconnect pattern extending along a first direction; and
- a third metal interconnect pattern and a fourth metal interconnect pattern extending along a second direction.

4. The semiconductor device of claim 3, wherein the first metal interconnect pattern overlaps the third metal interconnect pattern at a first corner, the first metal interconnect pattern overlaps the fourth metal interconnect pattern at a second corner, the second metal interconnect pattern overlaps the third metal interconnect pattern at a third corner, and the second metal interconnect pattern overlaps the fourth metal interconnect pattern at a fourth corner.

5. The semiconductor device of claim 4, wherein one of MTJs overlap the first corner.

6. The semiconductor device of claim 4, wherein one of the MTJs overlap the second corner.

7. The semiconductor device of claim 4, wherein one of the MTJs overlap the third corner.

8. The semiconductor device of claim 4, wherein one of the MTJs overlap the fourth corner.

9. The semiconductor device of claim 1, wherein each of the MTJs comprises a square or rectangle according to a top view.

* * * * *